United States Patent
Iwasaki

(10) Patent No.: US 10,987,840 B2
(45) Date of Patent: Apr. 27, 2021

(54) EJECTION-MATERIAL EJECTION APPARATUS AND IMPRINTING APPARATUS

(71) Applicant: CANON KABUSHIKI KAISHA, Tokyo (JP)

(72) Inventor: Yuichi Iwasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 153 days.

(21) Appl. No.: 16/240,010

(22) Filed: Jan. 4, 2019

(65) Prior Publication Data
US 2019/0217516 A1    Jul. 18, 2019

(30) Foreign Application Priority Data
Jan. 15, 2018 (JP) ............................. JP2018-004329

(51) Int. Cl.
B29C 45/76 (2006.01)
B29C 45/84 (2006.01)
G03F 7/00 (2006.01)
H01L 21/027 (2006.01)

(52) U.S. Cl.
CPC ........ B29C 45/7626 (2013.01); B29C 45/844 (2013.01); G03F 7/0002 (2013.01); H01L 21/027 (2013.01)

(58) Field of Classification Search
CPC ............... B41J 2/17556; B41J 2/17566; B41J 2/17596; B41J 2/01; B41J 11/00; G03F 7/0002
See application file for complete search history.

(56) References Cited

U.S. PATENT DOCUMENTS

| 5,729,256 A | * | 3/1998 | Yamanaka | B41J 2/17509 347/7 |
| 9,952,506 B2 | | 4/2018 | Arai | |
| 2009/0213188 A1 | * | 8/2009 | Shimada | B41J 2/161 347/71 |
| 2016/0026084 A1 | * | 1/2016 | Arai | G03F 7/0002 347/110 |
| 2016/0288378 A1 | * | 10/2016 | Arai | B29C 35/0805 |

FOREIGN PATENT DOCUMENTS

JP      2016-32103      3/2016

* cited by examiner

*Primary Examiner* — Joseph S Del Sole
*Assistant Examiner* — Mohamed K Ahmed Ali
(74) *Attorney, Agent, or Firm* — Venable LLP

(57) ABSTRACT

The internal space of a storing container is separated by a flexible membrane into a first storing space storing an ejection material and a second storing space storing an operating liquid. A change in electrical property of the flexible membrane resulting from entry of at least one of the ejection material and the operating liquid to the inside of the flexible membrane is detected.

10 Claims, 3 Drawing Sheets

EJECTION-MATERIAL EJECTION APPARATUS AND IMPRINTING APPARATUS

BACKGROUND OF THE INVENTION

Field of the Invention

The present invention relates to an ejection apparatus that ejects a liquid or liquid-like ejection material and to an imprinting apparatus including the ejection apparatus.

Description of the Related Art

As for an ejection apparatus that ejects a liquid or liquid-like ejection material stored in a storing container from an ejection head, Japanese Patent Laid-Open No. 2016-032103 describes a configuration using a storing container partitioned into two storing portions, namely first and second storing portions, by a flexible member. The first storing portion stores the ejection material, while the second storing portion stores a liquid, and the internal pressure of the second storing portion is controlled to indirectly adjust the internal pressure of the first storing portion. The liquid stored in the second storing portion differs in physical property from the ejection material in the first storing portion and does not get mixed with the ejection material. Damage of the flexible member is detected by detecting a change in physical property of the liquid in the second storing portion that occurs when the ejection material enters the second storing portion upon the occurrence of the damage of the flexible member.

SUMMARY OF THE INVENTION

However, to detect a change in physical property of the liquid in the second storing portion resulting from entry of the ejection material thereinto, entry of a certain amount of the ejection material is necessary. Thus, it takes time to detect damage of the flexible member after the occurrence of the damage.

The present invention provides an ejection-material ejection apparatus and an imprinting apparatus capable of quickly detecting damage of a flexible member and allowing one to handle the damage.

The first aspect of the present invention, there is provided an ejection-material ejection apparatus comprising:
  an ejection head that ejects an ejection material;
  a storing container with an internal space separated by a flexible membrane into a first storing space storing the ejection material to be supplied to the ejection head, and a second storing space storing an operating liquid;
  a pressure controller that controls internal pressure of the second storing space; and
  a detector that detects a change in electrical property of the flexible membrane resulting from entry of at least one of the ejection material and the operating liquid to inside of the flexible membrane.

The second aspect of the present invention, there is provided an imprinting apparatus that processes a substrate by transferring a pattern on a mold to an imprint material applied to the substrate, comprising an ejection-material ejection apparatus that ejects the imprint material as an ejection material to apply the imprint material to the substrate,
  wherein the ejection-material ejection apparatus includes
  an ejection head that ejects the ejection material,
  a storing container with an internal space separated by a flexible membrane into a first storing space storing the ejection material to be supplied to the ejection head, and a second storing space storing an operating liquid,
  a pressure controller that controls internal pressure of the second storing space, and
  a detector that detects a change in electrical property of the flexible membrane resulting from entry of at least one of the ejection material and the operating liquid to inside of the flexible membrane.

According to the present invention, a change in electrical property of the flexible membrane that occurs when at least one of the ejection material and the operating liquid enters the inside of the flexible membrane is detected. In this way, it is possible to quickly detect damage of the flexible member.

Further features of the present invention will become apparent from the following description of exemplary embodiments with reference to the attached drawings.

DESCRIPTION OF THE EMBODIMENTS

Figure 1:
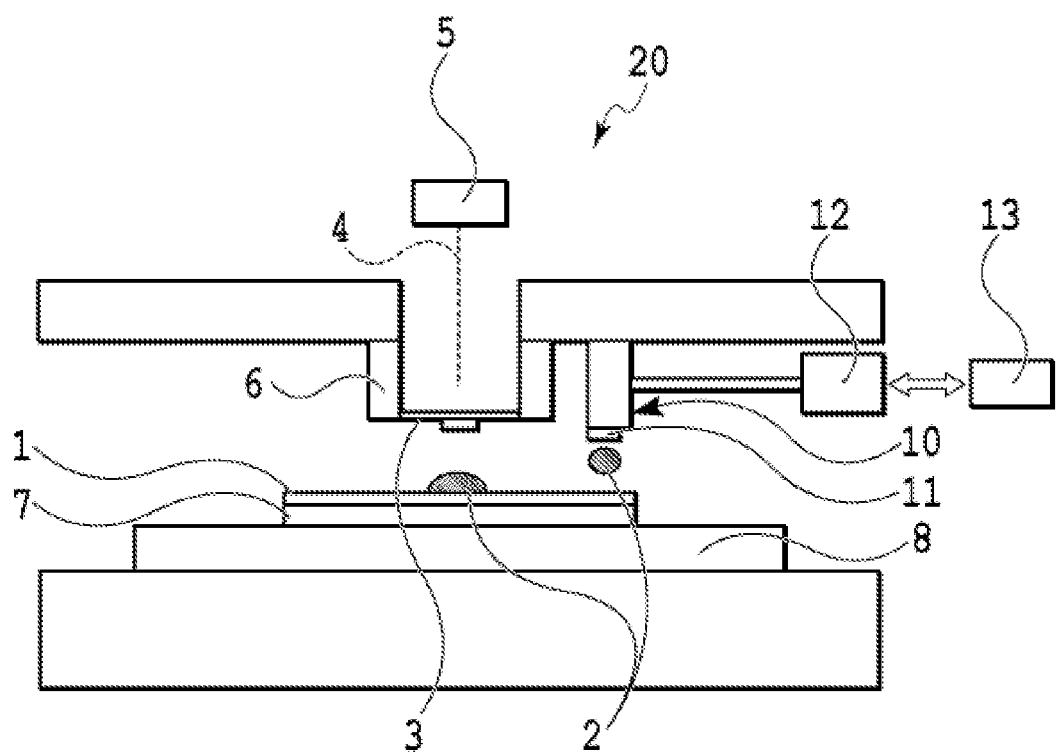
FIG. 1 is a configuration diagram of an imprinting apparatus in an embodiment of the present invention.

An embodiment of the present invention will now be described based on the accompanying drawings.

FIGS. 1 to 3B are schematic configuration diagrams of an ejection-material ejection apparatus in this embodiment, and the ejection apparatus in this embodiment represents an example in which it is employed in an imprinting apparatus 20.

Imprinting apparatuses are used to manufacture products as typified by semiconductor devices. The imprinting apparatus 20 presses a mold 3 having a molding pattern against uncured resin (resist) 2 which is an imprint material applied to a shot region on a substrate 1 and, in this state, irradiates the resin 2 with light 4 (e.g. ultraviolet rays) to cure the resin 2. Thereafter, the imprinting apparatus 20 separates the mold 3 from the cured resin 2. As a result, the pattern on the mold 3 is transferred to the substrate 1. The imprinting apparatus 20 in this embodiment is an imprinting apparatus employing an optical imprinting method and includes a light irradiation unit 5, a mold hold unit 6, a substrate chuck 7, a substrate stage 8, an ejection apparatus 10 for the resin 2 as an ejection material, an ejection head 11, a pressure control unit 12, and a control unit 13.

In imprinting, the light irradiation unit 5 irradiates the resin 2 with the light 4 through the mold 3. The wavelength of the light 4 is a wavelength suitable for the resin 2 to be cured. The pattern to be transferred, such as a circuit pattern, is formed on the surface of the mold 3 that faces the substrate 1. Quartz or the like that can transmit the light 4 can be used as the material of the mold 3. The mold hold unit 6 includes a mold chuck not illustrated that holds the mold 3, a mold drive mechanism not illustrated that holds this mold chuck movably, and a magnification correction mechanism not illustrated that corrects the shape of the mold 3. The substrate 1 is a silicon wafer, a SOI (silicon on insulator) substrate, a glass substrate, or the like.

On the substrate 1, there are multiple shots as pattern formation regions arranged in a particular shot layout. At each shot, immediately before imprinting, droplets containing the resin 2 are ejected from the ejection ports of the ejection head 11 and the resin 2 is applied onto the substrate 1. The pattern formed on the mold 3 is then impressed into the resin 2. As a result, a pattern of the resin 2 is formed on the substrate 1. The substrate chuck 7 holds the substrate 1, and the substrate stage 8 holds the substrate chuck 7 movably along with the substrate 1. The substrate stage 8 positions the mold 3 and the substrate 1 with respect to each other after the ejection head 11 applies the resin 2. The imprinting is performed in conjunction with this positioning. The resin 2 stored in the ejection apparatus 10 is ejected from the ejection head 11, which is provided with multiple ejection ports, and applied onto the substrate 1.

In this series of imprinting actions, movement of the substrate 1 to a shot position, ejection and application of the resin 2, impressing, positioning, curing of the resin 2, releasing of the mold, and movement of the substrate 1 to the next shot position are performed sequentially, and this series of actions for processing the substrate 1 is repeated as needed.

Figure 2:
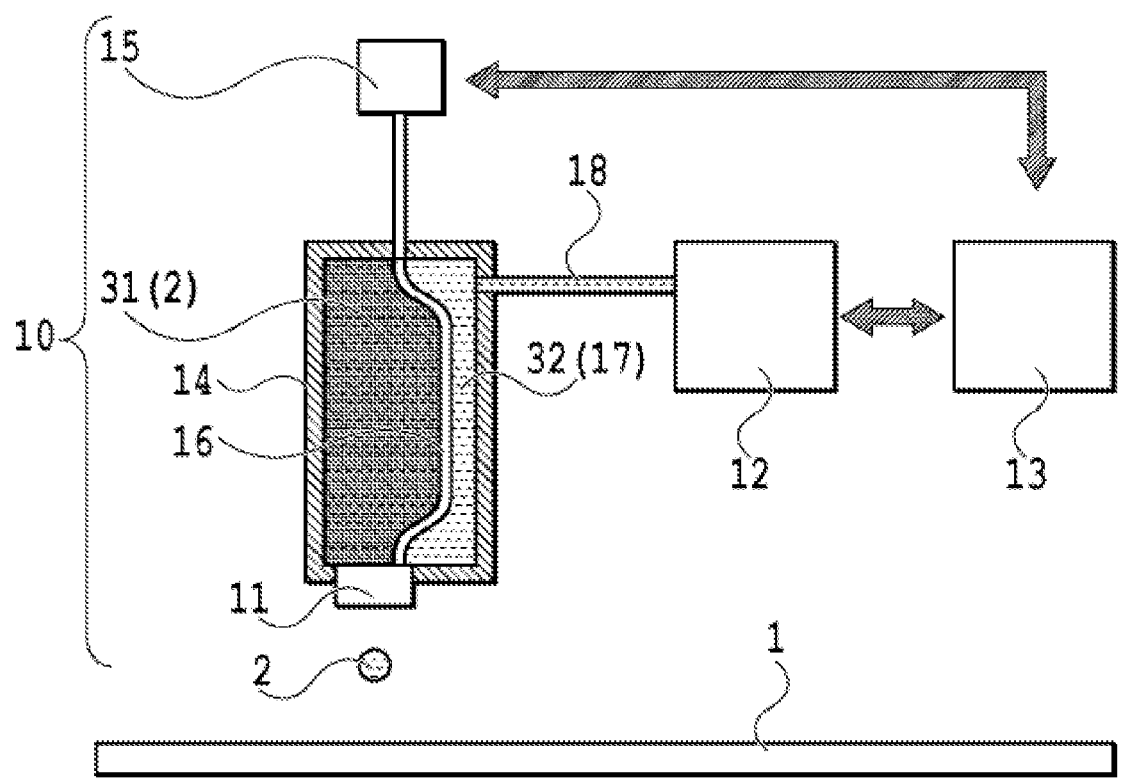
FIG. 2 is a configuration diagram of an ejection apparatus in FIG. 1.

FIG. 2 is a schematic configuration diagram of the ejection apparatus 10 in this embodiment.

The ejection apparatus 10 in this embodiment includes the ejection head 11, a storing container 14, the pressure control unit 12, the control unit 13, and a pressure measurement unit 15. The storing container 14 includes a flexible membrane 16 that separates its internal space into a first storing space 31 and a second storing space 32. The first storing space 31, which communicates with the ejection head 11, is filled with the resin 2 (ejection material). The control unit 13 controls the ejection head 11 to eject the resin 2 from the ejection ports of the ejection head 11. In the ejection head 11, an actuator is installed in each of pressure chambers provided individually for the ejection ports. The actuator may only need to be an element capable of generating energy with which the resin 2 as the ejection material can be ejected in a fine droplet, e.g. a droplet of 1 pL. Specific examples include a piezoelectric element, a heating resistance element, and so on. The ejection head 11 may not be integrated with the storing container 14 but may be replaceably mounted to the storing container 14. The second storing space 32, which does not communicate with the ejection head 11, is filled with an operating liquid 17. Cooling water or the like used in conventional exposure apparatuses is usable as the operating liquid 17. For example, a liquid obtained by adding preservative, humectant, etc. to water is usable as the operating liquid 17. The second storing space 32 communicates with the pressure control unit 12, which supplies the operating liquid 17, through a communicating member 18.

The pressure control unit 12 includes a tank for the operating liquid 17, a pipe, a pressure sensor, a pump, a valve, and so on. The pressure control unit 12 controls the pressure of the operating liquid 17 inside the second storing space 32. The control unit 13 controls the supply of the operating liquid 17 from the pressure control unit 12 to the second storing space 32 to control the pressure of the resin 2 inside the first storing space 31 indirectly with the flexible membrane 16. As a result, the internal pressures of the first storing space 31 and the second storing space 32 are balanced so as to maintain a negative pressure for forming an appropriate meniscus inside each ejection port of the ejection head 11. This enables good ejection of the resin 2.

As the ejection of the resin 2 from the ejection head 11 in the series of imprinting actions is repeated, the amount of the resin 2 inside the first storing space 31 decreases. Accordingly, the flexible membrane 16 moves so as to decrease the capacity of the first storing space 31 and increase the capacity of the second storing space 32. This movement of the flexible membrane 16 replenishes the operating liquid 17 in the second storing space 32 from the tank for the operating liquid 17 in the pressure control unit 12. The resin 2, used in the imprinting apparatus 20, is a resin in which foreign matters (small particles) and metal ions have been reduced to extremely small amounts, and needs to maintain this state until being ejected from the ejection head 11. The imprinting apparatus 20 in this embodiment holds the resin 2 isolated from the outside of the first storing space 31 during the entire period until the resin 2 inside the first storing space 31 is consumed substantially completely by repetition of ejection of the resin 2. Thus, the resin 2 is free from contact with devices such as a pressure sensor. This makes it possible to suppress increase of foreign matters and metal ions persistently from the state where the resin 2 is sealed in the first storing space 31.

Figures 3A, 3B:
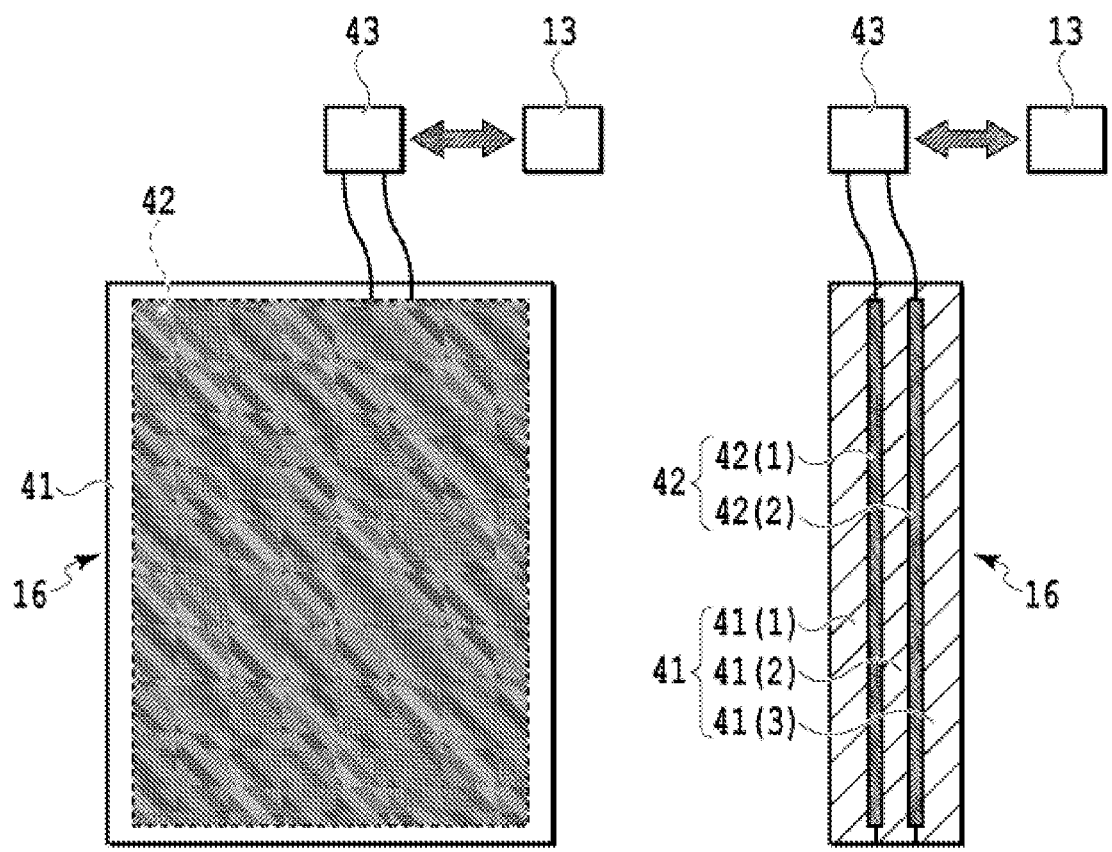
FIGS. 3A and 3B are configuration diagrams of a flexible membrane in FIG. 2.

FIG. 3A is front view of the flexible membrane 16, and FIG. 3B is a cross-sectional view of the flexible membrane 16.

The flexible membrane 16 includes an electrically insulative part 41 and a pair of electrically conductive layers (electrodes) 42 situated inside the electrically insulative part 41 along substantially the entire flexible membrane 16. The electrically insulative part 41 includes a first electrically insulative portion 41(1), a second electrically insulative portion 41(2), and a third electrically insulative portion 41(3). The electrically conductive layers 42 include a first electrically conductive layer 42(1) situated between the first electrically insulative portion 41(1) and the second electrically insulative portion 41(2), and a second electrically conductive layer 42(2) situated between the second electrically insulative portion 41(2) and the third electrically insulative portion 41(3). The first and second electrically conductive layers 42(1) and 42(2), which are disposed to face each other with the second electrically insulative portion 41(2) therebetween, are connected to an electricity measurement unit (detection unit) 43 for detecting the state of electrical conduction between them (electrodes), and the result of detection by this electricity measurement unit 43 is input into the control unit 13.

The first and third electrically insulative portions 41(1) and 41(3) contact the resin 2 and the operating liquid 17. Thus, as their materials, it is preferable to use materials high in chemical resistance and low in amount of metal dissolution, such as a fluororesin (such as PFA) film, for example. As the material of the second electrically insulative portion 41(2), a material that is high in electrical insulation performance and can be formed into a thin film is preferable. Examples of such a material include polyimides.

The material of the electrically conductive layers 42 (42(1), 42(2)) is preferably an electrically conductive material that can be formed into a thin film, and the electrically conductive layers 42 (42(1), 42(2)) are preferably made of aluminum or gold, for example. The thickness of each electrically conductive layer 42 (42(1), 42(2)) is preferably as small as possible. Specifically, the thickness is preferably 5 µm or smaller. In the case of using aluminum as the material of the first and second electrically conductive layers 42(1) and 42(2), they may have a layer of aluminum oxide formed on their surfaces, and these first and second electrically conductive layers 42(1) and 42(2) may be attached to each other. In this case, the layers made of aluminum oxide on their surfaces function as the second electrically insulative portion 41(2). In this way, the electrically conductive layers 42 (42(1), 42(2)) and the second electrically insulative portion 41(2) can be formed integrally with each other. The thickness of the flexible membrane 16 as a whole is preferably as small as possible. Specifically, the thickness is preferably 200 μm or smaller and more preferably 50 μm or smaller.

If the flexible membrane 16 is damaged, the operating liquid 17, which is electrically conductive, will enter the gap between the first and second electrically conductive layers 42(1) and 42(2), so that the electrical resistance (electrical conductivity) therebetween will change. If at least the third electrically insulative portion 41(3) and the second electrically insulative portion 41(2) are damaged, the operating liquid 17 will enter the gap between the first and second electrically conductive layers 42(1) and 42(2) and bring the first and second electrically conductive layers 42(1) and 42(2) into an electrically connected state. The electricity measurement unit 43 measures the electrical conductivity between the first and second electrically conductive layers 42(1) and 42(2), and the control unit 13 detects whether the flexible membrane 16 is damaged based on that measurement data. If determining that the flexible membrane 16 has been damaged, the control unit 13 issues an instruction to stop the operation of the imprinting apparatus 20 including that of the ejection apparatus 10. There is a case where the first electrically insulative portion 41(1) is not damaged when the operating liquid 17 enters the inside of the flexible membrane 16. In this case, it is possible to detect and handle the damage of the flexible membrane 16 before the operating liquid 17 enters the first storing space 31.

Normally, the pressure control unit 12 controls the pressure inside each of the first and second storing spaces 31 and 32 at about −0.3 kPa. For this reason, even when the flexible membrane 16 is damaged, it is difficult for the resin 2 and the operating liquid 17 to enter the inside of the flexible membrane 16. Thus, the pressure control unit 12 pressurizes the operating liquid 17 with predetermined detection timing to actively cause the operating liquid 17 to enter the gap between the electrically conductive layers 42(1) and 42(2) from the spot where the flexible membrane 16 is damaged (damaged spot) and electrically connect the electrically conductive layers 42(1) and 42(2). The detection timing to pressurize the operating liquid 17 is set as appropriate to avoid periods such as during replacement of the substrate 1 and during an operation of ejecting the resin 2 to the substrate 1 so that the ejection of the resin 2 from the ejection head 11 can be maintained accurate. The pressurizing force applied to the operating liquid 17 in this operation is 0 to 30 kPa and more preferably 5 to 10 kPa. The pressurizing force is set as appropriate in accordance with the surface tension of the ejection material, such as the resin 2, the shape of the nozzles in the ejection head 11, and so on.

In the case where the resin 2 is electrically conductive, it is possible to detect damage of the flexible membrane 16 as the resin 2 can enter the inside of the flexible membrane 16 and change the electrical resistance (electrical conductivity) between the first and second electrically conductive layers 42(1) and 42(2). If at least the first electrically insulative portion 41(1) and the second electrically insulative portion 41(2) are damaged, the resin 2 will enter the gap between the first and second electrically conductive layers 42(1) and 42(2) and bring the first and second electrically conductive layers 42(1) and 42(2) into an electrically connected state. With the pressure control unit 12 pressurizing the operating liquid 17 with the predetermined detection timing, the resin 2 is actively caused to enter the gap between the electrically conductive layers 42(1) and 42(2) from the damaged spot in the flexible membrane 16 and electrically connect the electrically conductive layers 42(1) and 42(2). In other words, a pressure difference is generated between the first and second storing spaces 31 and 32 to make it easier for the electrically conductive resin 2 to enter the inside of the flexible membrane 16 from the damaged spot in the flexible membrane 16, as in the case where the electrically conductive operating liquid 17 is caused to enter the inside of the flexible membrane 16 from a damaged spot therein. Also, there is a case where the third electrically insulative portion 41(3) is not damaged when the resin 2 enters the inside of the flexible membrane 16. In this case, it is possible to detect and handle the damage of the flexible membrane 16 before the resin 2 enters the second storing space 32.

As described above, if the flexible membrane 16 is damaged, at least one of the operating liquid 17 and the resin 2 will bring the electrically conductive layers 42(1) and 42(2) into an electrically connected state. By using this, it is possible to quickly detect the damage of the flexible membrane 16. Thus, upon damage of the flexible membrane 16, it is possible to quickly stop the operation of the imprinting apparatus 20 and thus enhance the throughput yield of the substrate 1.

Other Embodiments

In the above embodiment, damage of the flexible membrane 16 is detected by detecting a change in electrical conductivity between the electrically conductive layers 42(1) and 42(2) in the flexible membrane 16. However, it is only necessary to detect a change in electrical property of the flexible membrane 16 that occurs when at least one of the resin 2 and the operating liquid 17 enters the inside of the flexible membrane 16, and that electrical property is not limited to electrical conductivity but may be capacitance or the like. Also, a single electrode may be formed with an electrically conductive layer inside the flexible membrane 16, and damage of the flexible membrane 16 may be detected based on whether or not an electrically connected state has occurred between that electrode and the resin 2 or the operating liquid 17.

The present invention is applicable also to apparatuses and methods for manufacturing products such as semiconductor IC elements, liquid crystal display elements, and MEMS by using an exposure apparatus. Such products are manufactured by: a step of exposing a substrate (a wafer, a glass substrate, or the like) coated with a photosensitive agent to light with an exposure apparatus; a step of developing the substrate (photosensitive agent); and a well-known step of processing the developed substrate. The well-known step of processing the substrate includes etching, separation of the resist, dicing, bonding, packaging, and so on. By applying the present invention to manufacturing apparatuses as above, it is possible to correctly eject the photosensitive agent to the substrate and thus manufacture a high-quality product.

Also, the present invention is applicable to a wide range of ejection apparatuses that eject various kinds of ejection materials. The present invention is applicable also to containers that store liquid or liquid-like materials separately from each other by means of a flexible membrane. Also, the containers may be ones with the inside partitioned into three or more spaces by flexible membranes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-004329, filed Jan. 15, 2018, which is hereby incorporated by reference wherein in its entirety.

What is claimed is:

1. An ejection-material ejection apparatus comprising:
an ejection head that ejects an ejection material which is electrically conductive;
a storing container with an internal space separated by a flexible membrane into a first storing space storing the ejection material to be supplied to the ejection head, and a second storing space storing an operating liquid which is electrically conductive;
a pressure controller that controls internal pressure of the second storing space; and
a detector that detects a change in electrical conductivity between a pair of electrodes disposed to face each other inside the flexible membrane,
wherein the detector detects a change in electrical property of the flexible membrane resulting from entry of at least one of the ejection material and the operating liquid to inside of the flexible membrane.

2. The ejection-material ejection apparatus according to claim 1, wherein the detector includes a pair of electrically conductive layers as the pair of electrodes, the electrically conductive layers facing each other with an electrically insulative portion therebetween.

3. The ejection-material ejection apparatus according to claim 2, wherein each of the pair of electrically conductive layers is made of aluminum and has aluminum oxide on a surface thereof as the electrically insulative portion.

4. The ejection-material ejection apparatus according to claim 1, wherein
the detector detects the change in electrical conductivity of the flexible membrane with predetermined detection timing, and
the pressure controller controls the internal pressure of the second storing space so as to generate a pressure difference between the first storing space and the second storing space with the detection timing.

5. The ejection-material ejection apparatus according to claim 4, wherein, in a case of pressurizing the second storing space with the detection timing, the pressure controller controls the internal pressure of the second storing space at 0 to 30 kPa.

6. The ejection-material ejection apparatus according to claim 1, wherein
the detector detects the change in electrical conductivity of the flexible membrane resulting from entry of the operating liquid to the inside of the flexible membrane.

7. The ejection-material ejection apparatus according to claim 6, wherein
the detector detects the change in electrical conductivity of the flexible membrane with predetermined detection timing, and
the pressure controller controls the internal pressure of the second storing space so as to generate a pressure difference between the first storing space and the second storing space with the detection timing.

8. The ejection-material ejection apparatus according to claim 1, further comprising a controller that issues an instruction to stop operation of the ejection-material ejection apparatus when the detector detects the change in electrical property.

9. The ejection-material ejection apparatus according to claim 1, wherein thickness of the flexible membrane is 200 μm or less.

10. An imprinting apparatus that processes a substrate by transferring a pattern on a mold to an imprint material applied to the substrate, comprising an ejection-material ejection apparatus that ejects the imprint material as an ejection material to apply the imprint material to the substrate,
wherein the ejection-material ejection apparatus includes:
an ejection head that ejects the ejection material which is electrically conductive;
a storing container with an internal space separated by a flexible membrane into a first storing space storing the ejection material to be supplied to the ejection head, and a second storing space storing an operating liquid which is electrically conductive;
a pressure controller that controls internal pressure of the second storing space; and
a detector that detects a change in electrical conductivity between a pair of electrodes disposed to face each other inside the flexible membrane,
wherein the detector detects a change in electrical property of the flexible membrane resulting from entry of at least one of the ejection material and the operating liquid to inside of the flexible membrane.

* * * * *